United States Patent
Kawahito

(10) Patent No.: US 8,907,388 B2
(45) Date of Patent: Dec. 9, 2014

(54) OPTICAL-INFORMATION ACQUIRING ELEMENT, OPTICAL INFORMATION ACQUIRING ELEMENT ARRAY, AND HYBRID SOLID-STATE IMAGING DEVICE

(75) Inventor: Shoji Kawahito, Hamamatsu (JP)

(73) Assignee: National University Corporation Shizuoka University, Shizuoka (JP)

( * ) Notice: Subject to any disclaimer, the term of this patent is extended or adjusted under 35 U.S.C. 154(b) by 147 days.

(21) Appl. No.: 13/577,112

(22) PCT Filed: Feb. 4, 2011

(86) PCT No.: PCT/JP2011/052447
§ 371 (c)(1),
(2), (4) Date: Aug. 3, 2012

(87) PCT Pub. No.: WO2011/096549
PCT Pub. Date: Aug. 11, 2011

(65) Prior Publication Data
US 2012/0301150 A1    Nov. 29, 2012

(30) Foreign Application Priority Data
Feb. 5, 2010    (JP) ................................. 2010-024791

(51) Int. Cl.
| H01L 27/146 | (2006.01) |
| H04N 5/3745 | (2011.01) |
| H01L 27/144 | (2006.01) |
| H01L 21/28 | (2006.01) |

(52) U.S. Cl.
CPC ...... *H01L 27/14609* (2013.01); *H01L 27/1443* (2013.01); *H01L 21/28282* (2013.01); *H04N 5/3745* (2013.01); *H01L 27/14656* (2013.01)
USPC ............................ 257/292; 257/222; 257/225

(58) Field of Classification Search
CPC ..................... H01L 21/28282; H01L 27/1443; H01L 27/14609
USPC ......................................... 257/222, 225, 292
See application file for complete search history.

(56) References Cited

U.S. PATENT DOCUMENTS
4,875,084 A * 10/1989 Tohyama ...................... 257/436
5,621,231 A      4/1997 Kawamoto et al.
(Continued)

FOREIGN PATENT DOCUMENTS
EP       1 231 642 A1      8/2002
JP       62-230273 A      10/1987
(Continued)

OTHER PUBLICATIONS

International Search Report, International Application No. PCT/JP2011/052447, dated Mar. 29, 2011.
(Continued)

*Primary Examiner* — Nicholas Tobergte
(74) *Attorney, Agent, or Firm* — Novak Druce Connolly Bove + Quigg LLP

(57) ABSTRACT

A optical-information acquisition element encompasses a semiconductor layer (31) of a p-type, a surface-buried region (33) of a n-type buried in the semiconductor layer (31) so as to implement a photodiode with the semiconductor layer (31), a charge-accumulation region (36) of the n-type buried in the surface-buried region (33), configured to accumulate charges generated by the photodiode, a barrier-creating region of the p-type buried in the surface-buried region (33) so as to sandwich the surface-buried region (33) with the semiconductor layer (31), configured to create a potential barrier, and a charge-exhaust region (34) of the n-type buried in the semiconductor layer (31), configured to store and to extract excess charges which surmount the potential barrier and flow out from the charge-accumulation region (36). The changes of potential level of the charge-accumulation region (36) are extracted as signals, after receiving optical-communication signals. An optical-information-acquisition element array and a hybrid solid-state imaging device are also provided.

3 Claims, 12 Drawing Sheets

(56) References Cited

U.S. PATENT DOCUMENTS

| | | | |
|---|---|---|---|
| 6,051,447 A | 4/2000 | Lee et al. | |
| 6,372,537 B1* | 4/2002 | Lee et al. | 438/48 |
| 6,963,116 B2* | 11/2005 | Kawahito | 257/414 |
| 7,781,811 B2* | 8/2010 | Kawahito et al. | 257/292 |
| 7,843,029 B2* | 11/2010 | Kawahito et al. | 257/461 |
| 7,910,964 B2* | 3/2011 | Kawahito et al. | 257/292 |
| 8,289,427 B2* | 10/2012 | Kawahito | 348/302 |
| 8,338,248 B2* | 12/2012 | Kawahito | 438/233 |
| 8,558,293 B2* | 10/2013 | Kawahito et al. | 257/292 |
| 8,587,709 B2* | 11/2013 | Kawahito et al. | 348/302 |

FOREIGN PATENT DOCUMENTS

| | | | |
|---|---|---|---|
| JP | 5-251684 A | 9/1993 | |
| JP | 06338524 A * | 12/1994 | H01L 21/339 |
| JP | 11-112006 A | 4/1999 | |
| WO | 2010/074252 A1 | 7/2010 | |
| WO | 2010/092928 A1 | 8/2010 | |

OTHER PUBLICATIONS

English Abstract for JP 5251684 A, published Sep. 28, 1993.
English Abstract for JP 62230273 A, published Oct. 8, 1987.
English Abstract for JP 11112006 A, published Apr. 23, 1999.
Shinya Itch et al., "A CMOS Image Sensor for Car to Car/Road to Car Optical Communication Systems and evaluation of the optical communication pixel", ITE Technical Report, Mar. 19, 2009, pp. 33-36, vol. 33, No. 18, Institute of Image Information and Television Engineers, Technical Group on Information Sensing Technologies (IST).
Extended European Search Report issued by European Patent Office on Mar. 5, 2014 for the corresponding European patent application No. 11739897.4.

* cited by examiner

Fig. 5
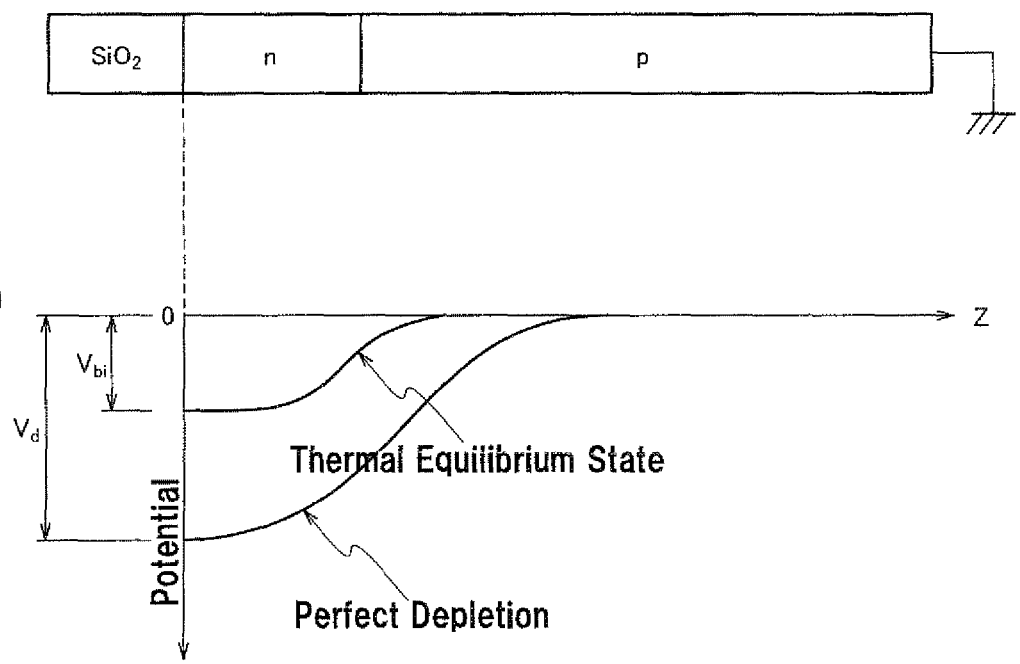

Fig. 8
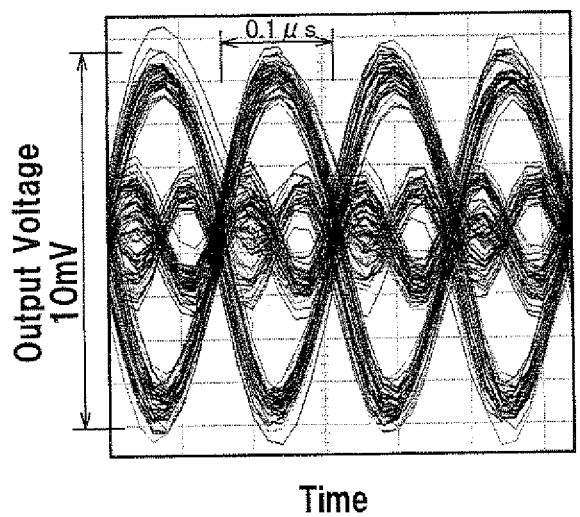
(a)
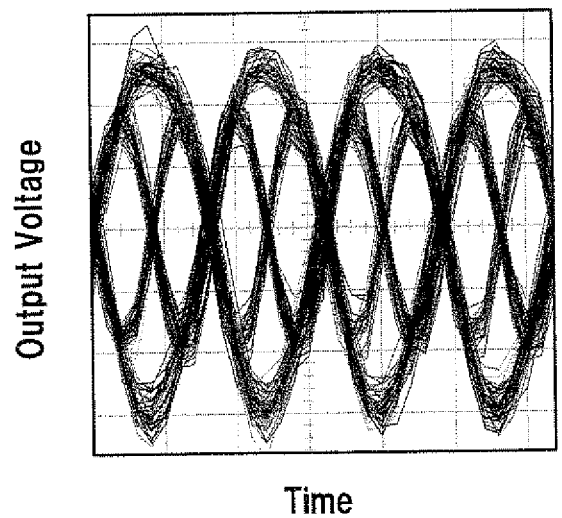
(b)

Fig. 10
(a) 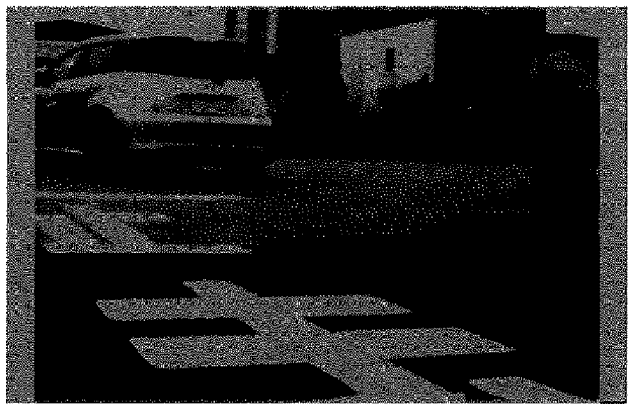
(b) 

US 8,907,388 B2

OPTICAL-INFORMATION ACQUIRING ELEMENT, OPTICAL INFORMATION ACQUIRING ELEMENT ARRAY, AND HYBRID SOLID-STATE IMAGING DEVICE

TECHNICAL FIELD

The present invention pertains to an optical-information acquisition element that has a function for transferring and accumulating electrons generated by light, which is received as an optical-communication signal, an optical-information-acquisition element array, in which a plurality of the optical-information acquisition elements are arrayed periodically in a one-dimensional or two-dimensional configuration, and a hybrid solid-state imaging device in which a plurality of the optical-information acquisition elements and a plurality of pixels for detecting image signals are arrayed on the same semiconductor chip.

BACKGROUND ART

Light emitting diodes (LEDs) have begun to be used in traffic lights or tail lamps of vehicles. Consequently, the realization of a spatial wireless communication system through optical signals, in which LED arrays are used as light sources and, road information and information facilitating safe driving of the vehicles can be transmitted and received between the traffic light and the vehicles (road-to-vehicle) or between the vehicles (inter-vehicle or vehicle-to-vehicle), is greatly expected.

For example, as illustrated in FIG. 12(a), an optical-information acquisition element implemented by a photodiode (33, 31), which encompasses a p-type semiconductor layer 31 and an n-type surface-buried region 33 arranged on the semiconductor layer 31 is proposed (see Non-patent Literature (NPL) 1). A junction capacitor of the photodiode configured to generate signal charges is connected in parallel to the photodiode, and the junction capacitor serves as a charge-accumulation capacitor for accumulating the charges generated by photoelectric conversion. On the upper portion of the surface-buried region 33 (light-receiving cathode region), a p-type pinning layer 37 connected to ground potential (lower-level power supply) GND is arranged. Moreover, as shown on the right side of FIG. 12(a), on the surface of the semiconductor layer 31, an n-type charge-accumulation region 36, which serves as a floating diffusion region separated from the surface-buried region 33, is arranged, and an n-type reset-drain region 39 of a reset transistor is arranged, being separated from the charge-accumulation region 36. The charge-accumulation region 36 also serves as a reset-source region of the reset transistor. A first gate insulation film is formed on the semiconductor layer 31 between the charge-accumulation region 36 and the reset-drain region 39, and a second gate insulation film is formed on the semiconductor layer 31 between the surface-buried region 33 and the charge-accumulation region 36. On the first gate insulation film, a reset-gate electrode is arranged. Then, the charge-accumulation region 36, the reset-gate electrode and the reset-drain region 39 implement an nMOSFET, which serves as the reset transistor. On the second gate insulation film, a barrier-gate electrode is arranged, and with the semiconductor layer 31 as a source region, the barrier-gate electrode and the charge-accumulation region 36 serving as a drain region implement an nMOSFET, which serves as a barrier transistor.

FIG. 12(b) illustrates a potential profile of the conduction band at the surface portion of the semiconductor layer 31, when a voltage of a high level is applied to the barrier-gate electrode and consequently the barrier gate transistor is turned on and simultaneously, the voltage of the high level is applied to the reset-gate electrode and consequently the reset transistor is turned on. The carriers (electrons) generated in a charge-generation region (light-receiving anode region) are injected into the charge-accumulation region 36 that is lower in potential level than the surface-buried region 33. Since an impurity concentration of the surface-buried region 33 is set lower than an impurity concentration of the charge-accumulation region 36, the photodiode can be operated at a perfectly depleted potential, and the value of its capacitance is made independent of a response in the charge-accumulation region 36, and a parasitic capacitance $C_{FD}$ can be made small. For this reason, while sufficiently reserving the estate area of the photodiode, it is possible to respond to optical-communication signals at a high speed

CITATION LIST

Non-Patent Literature

NPL 1: Shinya Ito, and seven others, "A CMOS Image Sensor for Car to Car/Road to Car Optical Communication Systems and evaluation of the optical communication pixel", the institute of Image Information and Television Engineers, Technical Group on Information Sensing Technologies (IST), Mar. 19, 2009

SUMMARY OF INVENTION

Technical Problem

However, the full-fledged study of the optical communication system in which the information can be transmitted and received between road-to-vehicle or vehicle-to-vehicle has not been advanced substantially. For example, in the structure described in NPL 1, for facilitating a high-speed response of the optical-information acquisition element, a time constant τ is required to be made small. Consequently, the capacitance of a detector is required to be made small. However, the existence of the reset transistor disables the reduction in the parasitic capacitance such as its gate capacitance and the like. Hence, there is a difficulty in the high-speed response.

The present invention pertains to an image sensor having a communication capability between road-to-vehicle or vehicle-to-vehicle, focusing to a functionality of a CMOS image sensor. In particular, a single image sensor can carry out the image acquisition and the information acquisition through the optical communication simultaneously, and therefore, the single image sensor has an intelligent feature that can carry out a communication, while tracking transmission positions of optical signals simultaneously on the basis of images.

An object of the present invention is to provide an optical-information acquisition element having a capability of transferring and accumulating electrons, which are generated by a light received as the optical-communication signal, operating at a high speed in situations such that the communications between road-to-vehicle or vehicle-to-vehicle are carried out through the optical communications, and further, to provide an optical-information-acquisition element array operating at a high response speed, in which a plurality of optical-information acquisition elements are arrayed periodically in a one-dimensional or two-dimensional configuration, and to provide a hybrid solid-state imaging device having an intelligent feature, focusing to the performance of CMOS image sensor, in which a plurality of optical-information acquisition elements and a plurality of pixels for the image signals are arrayed on the same semiconductor chip, such that a single solid-state imaging device can carry out the image acquisition and the information acquisition through the optical communication at high speed and simultaneously, and that the communication is carried out while transmission positions of the optical signals are tracked on the basis of images.

Solution to Problem

In order to achieve the above objects, a first aspect of the present invention inheres in an optical-information acquisition element encompassing a semiconductor layer of a first conductivity type, a surface-buried region of a second conductivity type buried in a part of an upper portion of the semiconductor layer so as to implement a photodiode with the semiconductor layer, a charge-accumulation region of the second conductivity type buried in a part of the upper portion of the surface-buried region, configured to accumulate a part of charges generated by the photodiode, a barrier-creating region of the first conductivity type buried adjacent to the charge-accumulation region in a part of the upper portion of the surface-buried region so as to sandwich the surface-buried region with the semiconductor layer, configured to create a potential barrier against an outflow of the charges accumulated in the charge-accumulation region, and a charge-exhaust region of the second conductivity type buried adjacent to the surface-buried region in the other part of the upper portion of the semiconductor layer, configured to store and to extract excess charges which surmount the potential barrier and flow out from the charge-accumulation region. In the optical-information acquisition element pertaining to the first aspect, changes of potential level of the charge-accumulation region, determined by the charges accumulated in the charge-accumulation region on the basis of a height of the potential barrier in association with on and off operations of optical-communication signals, are extracted as signals.

A second aspect of the present invention inheres in an optical-information-acquisition element array, in which a plurality of optical-information acquisition elements pertaining to the first aspect are arrayed on the same semiconductor chip. In the optical-information-acquisition element array pertaining to this second aspect, changes of potential level of the charge-accumulation region, determined by the charges accumulated in the charge-accumulation region on the basis of a height of the potential barrier, are extracted as signals from each of the plurality of optical-information acquisition elements.

A third aspect of the present invention inheres in a hybrid solid-state imaging device encompassing a plurality of optical-information acquisition elements arrayed on a semiconductor chip, and a plurality of pixels for detecting image signals, arrayed on the same semiconductor chip, being merged with the plurality of the optical-information acquisition elements. In the hybrid solid-state imaging device pertaining to this third aspect, changes of potential level of the charge-accumulation region, determined by the charges accumulated in the charge-accumulation region on the basis of a height of the potential barrier in association with on and off operations of optical-communication signals, are extracted as signals from each of the plurality of optical-information acquisition elements, and image signals are extracted respectively from the plurality of pixels for the image signals.

Advantageous Effects of Invention

According to the present invention, it is possible to provide an optical-information acquisition element that can transfer and accumulate electrons, which are generated by the light received as the optical-communication signal, which can operate at a high speed in the optical communication, an optical-information-acquisition element array, having a behavior of high response speed, in which a plurality of the optical-information acquisition elements are arrayed periodically in a one-dimensional or two-dimensional configuration, and a hybrid solid-state imaging device in which a plurality of the optical-information acquisition elements and the pixels for the image signals are arrayed on the same semiconductor chip, such that the image acquisition and the information acquisition through the optical communication can be carried out simultaneously at the high speed, and therefore, the communication can be carried out, while the transmission positions of the optical signals are tracked by means of images.

BRIEF DESCRIPTION OF DRAWINGS

FIG. 1 is a schematic plan view illustrating an entire configuration of a system, including a layout of a hybrid solid-state imaging device (two-dimensional image sensor), being arranged on a semiconductor chip, pertaining to an embodiment of the present invention, and an external system connected to the semiconductor chip, the external system mainly processing an optical-communication signal;

FIG. 4($b$) is a potential diagram for charges (electrons) that corresponds to FIG. 4($a$) in which a lower direction is represented as a positive direction of a potential;

FIG. 5 is a view illustrating a perfectly depleted potential to determine a height of a potential barrier that is created between a charge-accumulation region and a charge-exhaust region, in the optical-information acquisition element pertaining to the embodiment of the present invention;

FIG. 8($a$) is an eye diagram in which in the external system illustrated in FIG. 3, the waveforms of the output pulses of the optical signal from the pixel for the optical-communication signal, prior to the use of a pulse equalizer, are continuously superimposed and displayed;

FIG. 8($b$) is an eye diagram illustrating that the quality of the pulse is improved by using the pulse equalizer;

FIG. 10(*a*) is a view illustrating an image imaged at the transmitter side of the optical-communication signal, by a CMOS camera of QVGA resolution;

FIG. 10(*b*) is a view illustrating a reproduced image of the image illustrated in FIG. 10(*a*), the reproduced image is generated by pixels for the optical-communication signal, when optical signals corresponding to the image of FIG. 10(*a*) are received by the pixels, after the optical signals are transmitted by an infrared LED array of 10×10 to the pixels, at a carrier frequency of 5 MHz;

FIG. 12(*b*) is a potential diagram for charges (electrons) in the optical-information acquisition element that corresponds to FIG. 12(*a*), in which a lower direction is represented as a positive direction of the potential.

DESCRIPTION OF EMBODIMENTS

Figure 12:
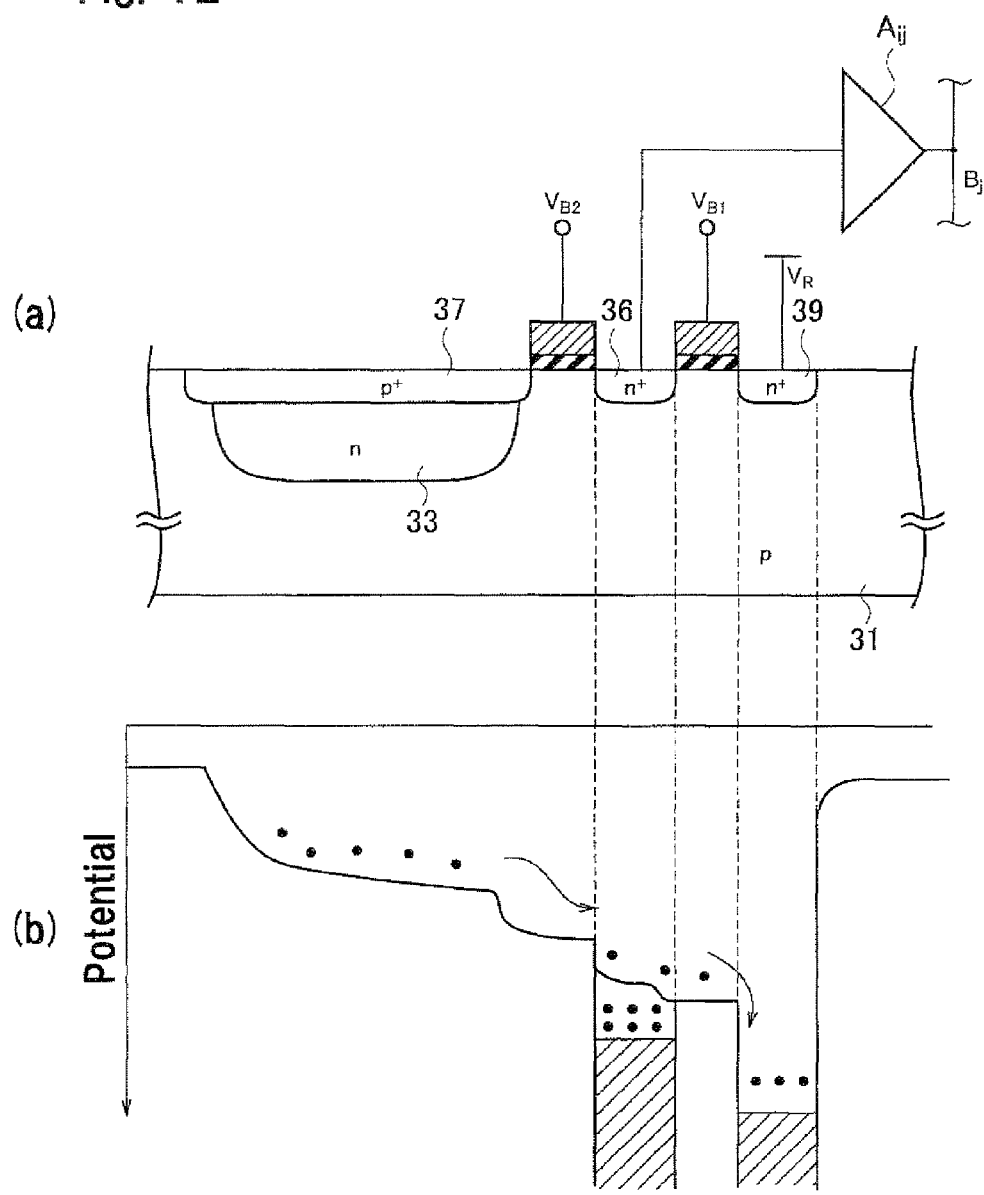
FIG. 12(*a*) is a schematic cross-sectional view illustrating a configuration of an optical-information acquisition element pertaining to a earlier technology, that is used as a comparative base technology of the present invention.

Next, with reference to the drawing illustrated in FIG. 12, which has been disclosed by NPL 1, the structure illustrated in FIG. 12 is used as a comparative base technology of the present invention. After the structure illustrated in FIG. 12 is reviewed, the embodiment of the present invention will be described below with reference to the drawings. In the descriptions of the following drawings, the same or similar reference numerals are given to the same or similar portions. However, attention should be paid to a fact that, since the drawings are only schematic, a relation between a thickness and a planar dimension, and, a ratio between the thicknesses of respective layers, and the like differ from the actual values. Thus, the specific thicknesses and dimensions should be judged by referring to the following explanations. Also, naturally, the portion in which the relation and ratio between the mutual dimensions are different is included even between the mutual drawings.

(Review of Earlier Technology)

In an optical-information acquisition element pertaining to an earlier technology illustrated in FIG. 12, a MOS transistor operates in the imperfect accumulation mode, to which a current generated in the photodiode is supplied, the current is caused by an optical pulse, so that the MOS transistor can operate in sub-threshold regime, thereby achieving both of a sufficient response speed and a high sensibility. A read-out signal of a pulse wave is applied to the gate electrode of the barrier transistor in the optical-information acquisition element pertaining to the earlier technology illustrated in FIG. 12. A voltage applied to the gate of the barrier transistor is set to a potential level at which all of electrons generated in the photodiode can be sent into the charge-accumulation region 36. As illustrated in FIG. 12(*a*), the gate electrode of a read-out transistor (whose illustration is omitted) implementing an amplifier $A_{ij}$ is connected to the charge-accumulation region 36. The drain electrode of the read-out transistor is connected to a higher-level power supply $V_{DD}$, and the source electrode is connected through a select transistor (whose illustration is omitted) to a vertical signal line $B_j$. When the read-out signal of the pulse wave is applied to the gate electrode of the barrier transistor, an input voltage $V_{FD}$ as a potential corresponding to a charge quantity transferred to the charge-accumulation region 36 is applied to the gate electrode of the read-out transistor in the amplifier $A_{ij}$. Then, the current corresponding to the potential at the charge-accumulation region 36 is amplified by the read-out transistor in the amplifier $A_{ij}$ and read out to the vertical signal line $B_j$.

The optical-information acquisition element pertaining to the earlier technology illustrated in FIG. 12 does not use a current amplifier. Thus, it is possible to miniaturize an element estate area, reduce electric power consumption and suppress noise. In particular, it is possible to expect the optical-information acquisition element of a miniaturized structure, which can acquire and process both of image information and optical-communication signal information. In particular, the optical-information acquisition element pertaining to the earlier technology is operated at imperfect accumulation mode, if the reset transistor is designed to be operated in sub-threshold regime (more typically, "weak inversion regime") when the optical-communication signal is received, and even if the minute optical-communication signal is received, a drain current $I_d$ flowing through the reset transistor can be amplified to a great value. Consequently, the input voltage $V_{FD}$ to the amplifier $A_{ij}$ can be designed to be high, which enables the detection of the optical-communication signal of a higher sensibility.

Moreover, when a configuration in which the barrier transistor is connected between the photodiode and the amplifier $A_{ij}$ is employed, it becomes easy to design a structure in which an impurity concentration of the surface-buried region 33 is set lower than an impurity concentration of the charge-accumulation region 36. For this reason, according to the optical-information acquisition element pertain to the earlier technology, the photodiode can be operated at the perfectly depleted potential, and the value of the capacitance can be made independent of the response in the charge-accumulation region 36. Thus, the parasitic capacitance $C_{FD}$ can be made small. Hence, according to the optical-information acquisition element pertaining to the earlier technology, it is possible to expect the optical-information acquisition element that can respond to the optical-communication signal at a high speed, while sufficiently reserving the estate area of the photodiode and keeping the high sensibility.

When the photodiode (33, 31) is in a no-load condition, an optical current $I_{ph}$ also repeats between higher and lower level on the basis of the optical-communication signal. When the optical-communication signal is changed from lower level to higher level at a predetermined timing, the charges are generated in the photodiode (33, 31), and the optical current $I_{ph}$ is also changed from lower level to higher level. The optical-information acquisition element for acquiring the optical-communication signal information is set such that a gate voltage $V_{gs}$ of $V_{gs}<V_{th}$ is applied to the gate of the reset transistor connected to the photodiode (33, 31) and in weak inversion regime, so that diffusion current flows in the reset transistor. Thus, the drain current $I_d$ is also flows in the reset transistor in response to the optical current $I_{ph}$. In the sub-threshold regime of $V_{gs}<V_{th}$, since the drain current of the reset transistor is very small, the charges generated in the photodiode (33, 31) are accumulated in the junction capacitance (charge-accumulation capacitor) of the photodiode (33, 31) (the junction capacitance of the photodiode is connected in parallel to the photodiode and serves as the charge-accumulation capacitor for accumulating the charges generated by the photoelectric conversion). Consequently, the potential of the source electrode of the reset transistor is decreased. The drain current $I_d$ of the reset transistor in the sub-threshold regime is represented by the following Eq. (1).

$$I_d = I_{so} \exp(qV_{gs}/nkT)\{1-\exp(-qV_{ds}/kT)\} \quad (1)$$

Here, $I_{so}$ is a constant determined by the structure, q is the elementary charge of an electron, k is Boltzmann's constant, T is the absolute temperature, and n is the ideality factor of the diode. A source-to-drain voltage $V_{ds}$ of the reset transistor has a relationship with $V_T$ as $V_{ds} \gg V_T$, wherein $kT/q=V_T$ is defined as a thermal resistance. Thus, Eq. (1) is represented by the following Eq. (2).

$$I_d = I_{so} \exp(qV_{gs}/nkT) \quad (2)$$

Actually, the time constant τ=RC, which is composed of a resistive component R and a capacitive component C, exists in a series circuit (whose illustration is omitted) in which the photodiode (33, 31) is connected to the power supply. An operating resistance $R_{OP}$ in weak inversion regime of the reset transistor is represented by the following Eq. (3), when Eq. (2) is differentiated with respect to the source-to-drain voltage $V_{ds}$.

$$R_{OP} = nV_T/I_P \quad (3)$$

When the other inner resistive components such as the resistance of the bulk in the reset transistor and the like are ignored and the parasitic capacitance of the wiring on the input side in the amplifier $A_{ij}$ is assumed to be $C_{FD}$, the time constant τ of the series circuit in which the photodiode (33, 31) is connected to the power supply is represented by the following Eq. (4).

$$\tau = nC_{FD}V_T/I_P \quad (4)$$

Thus, when the optical current $I_{ph}$ is at higher level, the value of the drain current $I_d$ can be represented by a current rising characteristic, which is determined by the following Eq. (5).

$$I_d = I_P/\{1+(I_P/I_{dM}-1)\exp(-t/\tau)\} \quad (5)$$

The $I_P$ indicates the maximum value of the drain current $I_d$ and the maximum value of the optical current $I_{ph}$, and the $I_{dM}$ indicates the minimum value of the drain current $I_d$. When the drain current $I_d$ flows clue to the decrease of the potential of the source electrode of the reset transistor, a voltage drop across the inner resistance of the reset transistor, operating in the sub-threshold regime, changes the input voltage $V_{FD}$ of the amplifier $A_{ij}$.

When the optical-communication signal is changed from higher level to lower level, after the passage of a certain period of time, the generation of charges in the photodiode (33, 31) is stopped. However, since the reset transistor is set to operate in the weak inversion regime, the drain current $I_d$ continues to flow into the charge-accumulation capacitor (the junction capacitance of the photodiode), while the drain current $I_d$ attenuates with the time constant τ. That is, when the optical current $I_{ph}$ is at lower level, the value of the drain current $I_d$ can be represented by the following Eq. (6).

$$I_d = (I_P - I_{dM})\exp(-t/\tau) + I_{dM} \quad (6)$$

Under the condition of $I_P \gg I_{dM}$ and $t \gg \tau$, Eq. (6) can be approximated by the following Eq. (7).

$$I_d = I_P/(1+t/\tau) \quad (7)$$

That is, the charges accumulated in the charge-accumulation capacitor (the junction capacitance of the photodiode) are extracted through the reset transistor with time constant τ, and the input voltage $V_{FD}$ of the amplifier $A_{ij}$ illustrated in FIG. 12 increases. Consequently, the input voltage $V_{FD}$ of the amplifier $A_{ij}$ is fluctuated in response to the change in the optical current $I_{ph}$ between lower level and higher level. This fluctuated input voltage $V_{FD}$ of the amplifier $A_{ij}$ is read through the amplifier $A_{ij}$ out to an output signal line $B_j$. When a direct-current component removing-circuit whose illustration is omitted generates a digital signal corresponding to the fluctuated input voltage $V_{FD}$, this digital signal indicates the fluctuation corresponding to the optical-communication signal. In this way, the optical-information acquisition element can acquire the optical-communication signal information. As shown in Eqs (4) to (7), when the parasitic capacitance $C_{FD}$ is made sufficiently small, we can find that the optical-information acquisition element can carry out the high-speed response to the minute optical current amplitude $I_p$.

In order to operate the optical-information acquisition element at high-speed response, the time constant τ is required to be small, and the capacitance of the detector is required to be small. With regard to the capacitance of the detector, the gate capacitance of the reset transistor shall be considered, in addition to the junction capacitance of the photodiode (33, 31) or charge-accumulation region 36 serving as a detecting node, the gate capacitance of the read-out transistor implementing the amplifier $A_{ij}$ and the like. The junction capacitance of the charge-accumulation region 36 can be made sufficiently small, and furthermore, the gate capacitance of the read-out transistor can be made sufficiently small by the effect ascribable to the feature of the source-follower circuit, by which the gate capacitance seems to be multiplied by $(1-G_{SF})$ (wherein, $G_{SF}$ is a gain of the source-follower circuit).

Thus, it is understood that, if we can make the parasitic capacitance such as the gate capacitances of the read-out transistor and the reset transistor and the like smaller, it is possible to implement an optical-information acquisition element, which is suitable for the high-speed response. In the light of the above-mentioned review of the earlier technology, the following embodiment of the present invention will provide a technical idea of an elementary structure for reducing the parasitic capacitance, and examples of application of the elementary structure to solid-state imaging devices, as described below. Also, as to the technical idea of the present invention, the material quality, shape, structure, arrangement and the like of a configuration part are not specified, nor limited to the followings disclosure. Thus, various changes can be added to the technical idea of the present invention, within the technical scopes prescribed by claims.

Embodiment

Figure 1:
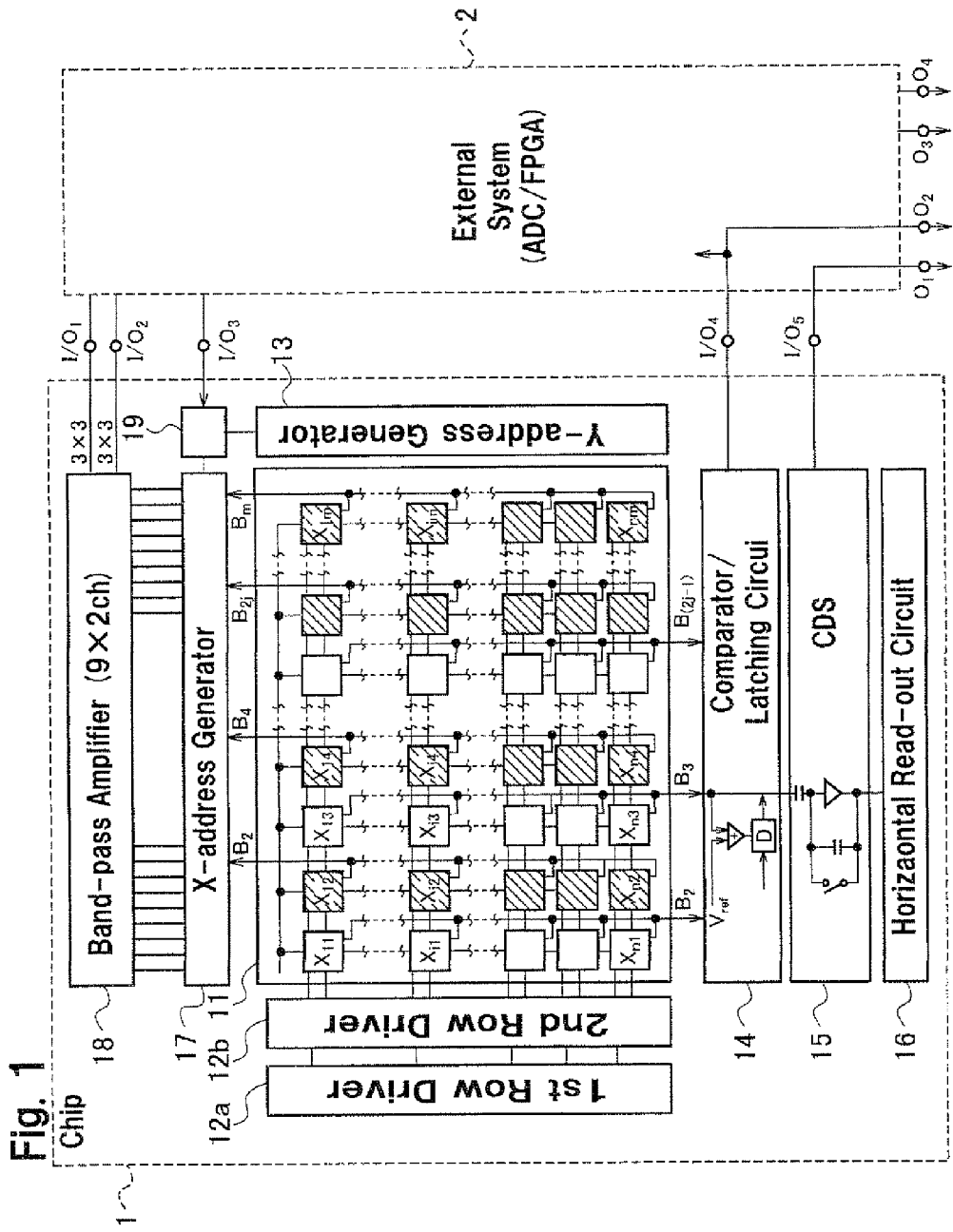
FIG. 1 is a schematic plan view illustrating a layout on a semiconductor chip of a solid-state imaging device (two-dimensional image sensor) pertaining to a first embodiment of the present invention.

A hybrid solid-state imaging device (two-dimensional image sensor) pertaining to an embodiment of the present invention encompasses a semiconductor chip 1 in which as illustrated in FIG. 1, a pixel-array area 11 and a peripheral circuit portion (12, 13, 14, ..., 18 and 19) are integrated, and an external system 2 which communicates with the semiconductor chip 1 and mainly processes the optical-communication signal, and has a function that can carry out the image acquisition and the information acquisition through the optical communication, simultaneously.

Figure 2:
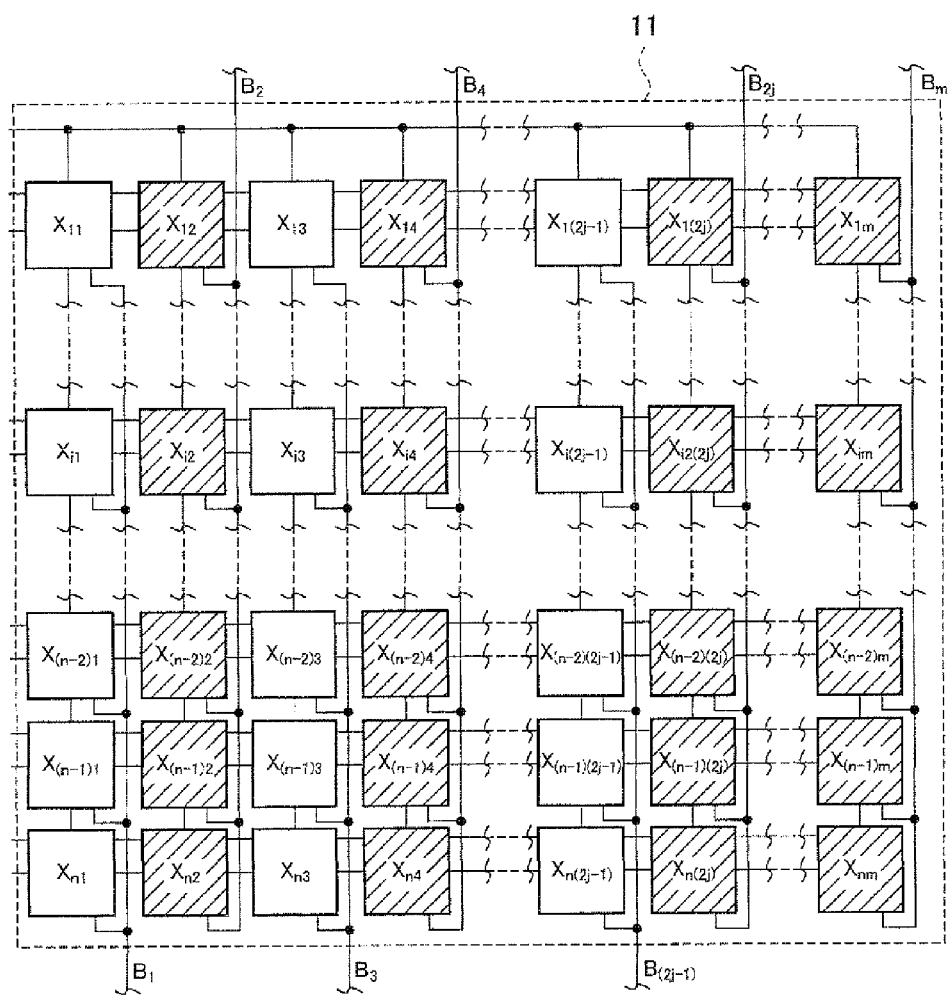
FIG. 2 is an enlarged view illustrating one example of a layout of a pixel-array area arrayed on the semiconductor chip illustrated in FIG. 1.

For implementing an intelligent feature of the hybrid solid-state imaging device, such that the hybrid solid-state imaging device can carrying out simultaneously the image acquiring operation and the information acquiring operation through the optical communication, and that the hybrid solid-state imaging device can carrying out the communication operation, while tracking the transmission positions of optical signals by means of images, a plurality of pixels $X_{i(2j-1)}$ (i=1 to m; j=1 to n; and m and n are integers, respectively) for image signals, which are arrayed on the odd-numbered column of a two-dimensional matrix, and a plurality of pixels $X_{i(2j)}$ for the optical-communication signals, which are arrayed on the even-numbered column, are merged and arrayed on the pixel-array area 11 integrated on the semiconductor chip 1, as shown in the enlarged view in FIG. 2. Because the planar pattern in which the plurality of the pixels $X_{i(2j-1)}$ for the image signals and the plurality of the pixels $X_{i(2j)}$ for the optical-communication signals are arrayed alternately and periodically is merely used for the sake of an exemplification, the planar pattern is not limited to a topology illustrated in FIG. 2. For example, a periodical configuration may be used in which, after two pixel columns for the image signals are continuously arrayed, a pixel column for the optical-communication signal is mixed and arrayed on the third column. Or, a periodical configuration may be used in which, after three pixel columns for the image signals are continuously arrayed, a pixel column for the optical-communication signal is arrayed on the fourth column. Also, the pixels for the image signals and the pixels for the optical-communication signals may be mixed and arrayed alternately and periodically in the shape of a checkered pattern (check). Each of the pixels $X_{i(2j-1)}$ for the image signals and the pixels $X_{i(2j)}$ for the optical-communication signals may implement, for example, a rectangular imaging area.

On the lower side of the pixel-array area 11, a comparator/latching circuit 14 for generating image signals, a correlative double sampling (CDS) circuit 15 and a horizontal read-out circuit 16 are provided along pixel rows $X_{11}$ to $X_{1m}$; ...; $X_{i1}$ to $X_{im}$; ...; $X_{(n-2)1}$ to $X_{(n-2)m}$; $X_{(n-1)1}$ to $X_{(n-1)m}$; and $X_{n1}$ to $X_{nm}$ directions. An X-address generator 17 for processing the optical-communication signals and a band-pass amplifier 18 are provided on the upper side of the pixel-array area 11. On the left side of the pixel-array area, a row driver 12 for generating the image signals is provided along pixel columns $X_{11}, \ldots, X_{i1}, X_{(n-2)1}, X_{(n-1)1}, X_{n1}; X_{12}, \ldots, X_{i2}, \ldots; X_{(n-2)2}, X_{(n-1)2}, X_{n2}; X_{13}, \ldots, X_{i3}, \ldots; X_{(n-2)3}, X_{(n-1)3}, X_{n3}; \ldots; X_{1(2j-1)}, \ldots, X_{i(2j-1)}, \ldots, X_{(n-2)(2j-1)}, X_{(n-1)(2j-1)}, X_{n(2j-1)}; \ldots; X_{1(2j)}, \ldots, X_{i(2j)}, \ldots, X_{(n-2)(2j)}, X_{(n-1)(2j)}, X_{n(2j)}; \ldots; X_{1m}, \ldots, X_{im}, \ldots, X_{(n-2)m}, X_{(n-1)m}$, and $X_{nm}$ directions. A Y-address generator 13 for processing the optical-communication signal is provided on the right side of the pixel-array area. A timing generator whose illustration is omitted is connected to the row driver 12 and the horizontal read-out circuit 16. The Y-address generator 13 and the X-address generator 17 are connected to each other through an address signal distributor 19.

Each of the band-pass amplifier 18, the address signal distributor 19 and the comparator/latching circuit 14 is connected to the external system 2, and the external system 2 processes the optical-communication signal. The unit pixels $X_{i(2j-1)}, X_{i(2j)}$ inside the pixel-array area 11 are sequentially scanned by the horizontal read-out circuit 16 and the row driver 12, and the reading out operation of the image signal and the processing of the image signal are executed. Then, a gray image output is extracted through the external system 2 from the comparator/latching circuit 14 and the correlative double sampling circuit 15 via the vertical signal lines $B_1, B_3, \ldots, B_{(2j-1)}, \ldots$ on the odd-numbered columns, and the optical-communication signals are read out via the vertical signal lines $B_2 B_4, \ldots B_{(2j)}$ on the even-numbered columns.

That is, the hybrid solid-state imaging device pertaining to the embodiment of the present invention is established such that, since the pixel-array area 11 is vertically scanned at the units of the respective pixel rows $X_{11}$ to $X_{1m}$; ...; $X_{i1}$ to $X_{im}$; ...; $X_{(n-2)1}$ to $X_{(n-2)m}$; $X_{(n-1)1}$ to $X_{(n-1)m}$; and $X_{n1}$ to $X_{nm}$, with regard to the pixel signals of the respective pixel rows $X_{11}$ to $X_{1m}$; ...; $X_{i1}$ to $X_{im}$; ...; $X_{(n-2)1}$ to $X_{(n-2)m}$; $X_{(n-1)1}$ to $X_{(n-1)m}$; and $X_{n1}$ to $X_{nm}$, the pixel signals for the images are read out via the vertical signal lines $B_1, B_3, \ldots, B_{(2j-1)}, \ldots$ on the odd-numbered columns laid for the pixels $X_{11}, \ldots, X_{i1}, \ldots, X_{(n-2)1}, X_{(n-1)1}; X_{n1}; X_{13}, \ldots, X_{i3}, \ldots; X_{(n-2)3}, X_{(n-1)3}, X_{n3}; \ldots, X_{1(2j-1)}, \ldots, X_{j(2j-1)}, \ldots, X_{(n-2)(2j-1)}, X_{(n-1)(2j-1)}, X_{n(2j-1)}; \ldots; X_{1m}, \ldots, X_{im}, \ldots, X_{(n-2)m}, X_{(n-1)m}$ and $X_{nm}$, on the respective odd-numbered columns, and the optical-communication signals are read out via the vertical signal lines $B_2 B_4, \ldots, B_{(2j)}; \ldots$ on the even-numbered columns laid for the pixels $X_{12}, \ldots, X_{i2}, \ldots, X_{(n-2)2}, X_{(n-1)2}, X_{n2}, X_{14}, \ldots, X_{i4}, \ldots, X_{(n-2)4}, X_{n4}; \ldots, X_{1(2j)}, \ldots, X_{i(2j)}, \ldots, X_{(n-2)(2j)}, X_{(n-1)(2j)}, X_{n(2j)}; \ldots$ on the respective even-numbered columns. The pixel signals read out from the vertical signal lines $B_1, B_3, \ldots, B_{(2j-1)}, \ldots$ on the respective odd-numbered columns are signally processed in the correlative double sampling circuit 15, and then transferred as the gray image signals through the external system 2 via the amplifier in the correlative double sampling circuit 15.

From the vertical signal lines $B_2 B_4, \ldots, B_{(2j)}, \ldots$ on the even-numbered columns, the optical-communication signals for each 3×3 block are read out to the band-pass amplifier 18 of 9×2 channels, and the optical-communication signals are processed by the external system 2.

Figure 3:
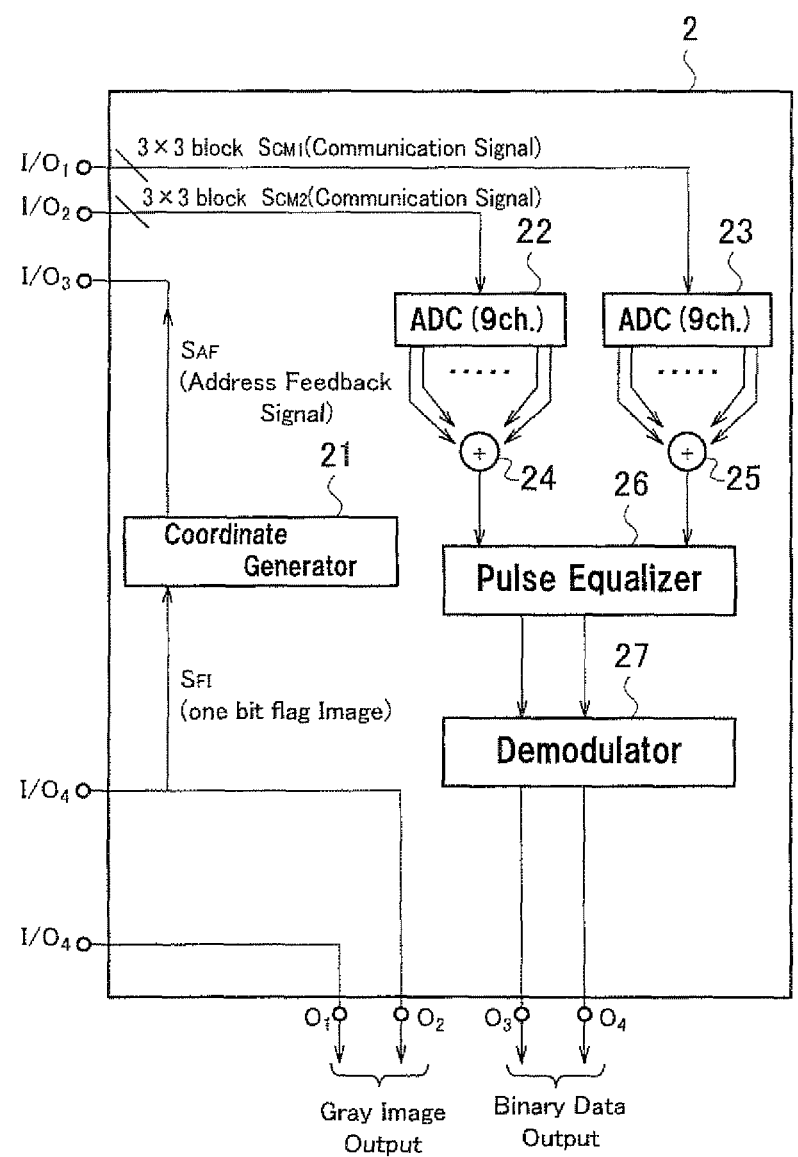
FIG. 3 is an exemplary block diagram illustrating the outline of the configuration of the external system illustrated in FIG. 1.

The external system 2 may be provided with, for example, an analog/digital converter (ADC), a field programmable gate array (FPGA) and the like. For example, as illustrated in FIG. 3, the external system 2 includes a first AD converter 23 for feeding an optical-communication signal $S_{CM1}$ of a first 3×3 block from the band-pass amplifier 18, through a first input/output node $I/O_1$, a second AD converter 22 for feeding an optical-communication signals $S_{CM2}$ of a second 3×3 block from the band-pass amplifier 18, through a second input/output node $I/O_2$, a first adder 25 for synthesizing digital signals of nine channels that are A/D converted by the first AD converter 23, a second adder 24 for synthesizing digital signals of nine channels that are A/D converted by the second AD converter 22, a pulse equalizer 26 for equalizing an output pulse of the first adder 25 and an output pulse of the second adder 24, and a demodulator 27 for demodulating the output pulse of the pulse equalizer 26 and transferring the optical-communication signals as a binary data from output nodes $O_3$ and $O_4$.

FIG. 8 is the eye diagram to evaluate the quality of the pulses transferred from the pixel $X_{i(2j)}$ for the optical-communication signals on the even-numbered columns in the semiconductor chip 1 that are measured at 10 Mbps. The analog outputs $S_{CM1}, S_{CM2}$ transferred from the band-pass amplifier 18 in the semiconductor chip 1 are digitized, with 10 bits 80 MHz, by the AD converters 22, 23 in the external system 2. Then, in digital region, the digitized outputs are synthesized and monitored by the first adder 25 and the second adder 24. Because the pixels $X_{i(2j)}$ for the optical-communication signals carries out asymmetric responses against the on/off operations of the optical signals, prior to the pass through the pulse equalizer 26, when the raw waveforms of the crude output pulses from the first adder 25 and the second adder 24 are continuously overlapped and displayed, as illustrated in FIG. 8(a), the raw overlapped waveform has a poor topology in which the eye height and the eye width of an opening (eye pattern) of the waveform trace are small, the characteristic of the waveform trace represents a deformed topology collapsing from the shape of a rectangular wave. As illustrated in FIG. 8(b), since the pulse equalizer 26 is used, it is known that the opening of the waveform trace is made wide and made close to the topology of the ideal rectangular wave, and the characteristic of the waveform trace is extremely improved. Then, with the use of the pulse equalizer 26, a resultant bit error rate is decreased from $8.2 \times 10^{-2}$ to $6.5 \times 10^{-6}$.

The external system 2 further includes a coordinate generator 21 configured to determine an X-Y address for tracking the signal source of the optical signal, after acquiring a flag image signal $S_{F1}$ of one bit through a fourth input/output node $I/O_4$ from the comparator/latching circuit 14, and then, the coordinate generator 21 transfers the X-Y address as an address feedback signal $S_{AF}$ through a third input/output node $I/O_3$ to the address signal distributor 19. The address signal distributor 19 distributes the X-address determined by the coordinate generator 21 to the X-address generator 17 and distributes the Y-address to the Y-address generator 13 and determines the desirable 3×3 block from the pixels $X_{12}, \ldots, X_{i2}, \ldots, X_{(n-2)2}, X_{(n-1)2}, X_{n2}; X_{14}, \ldots, X_{i4}, \ldots, X_{(n-2)4}, X_{(n-1)4}, X_{n4}; \ldots X_{1(2j)}, \ldots X_{i(2j)}, \ldots, X_{(n-2)(2j)}, X_{(n-1)(2j)}, X_{n(2j)}; \ldots$ on the respective even-numbered columns, and then tracks the signal source of the optical signals. The flag image signal $S_{F1}$ of one bit supplied through the fourth input/output node $I/O_4$ from the comparator/latching circuit 14 and the respective image signals supplied through a fifth input/output node $I/O_5$ from the correlative double sampling circuit 15 are propagated as their original states of signals through the external system 2, and transferred as the gray images from the output node $O_2$ and the output node $O_1$, respectively.

Figure 9:
FIG. 9 is a view illustrating a gray image that is imaged by a pixel X for the image signal, the pixel X is disposed on the semiconductor chip, pertaining to the embodiment of the present invention.

FIG. 9 illustrates a gray image that is imaged by the pixels $X_{i(2j-1)}$ for the image signals of the semiconductor chip 1 pertaining to the embodiment of the present invention, and FIG. 10 illustrates an image in which an image obtained by a camera of a QVGA resolution of 320×240 pixels is transmitted as optical signals from an LED light source side and then signally processed and reproduced by the pixels $X_{i(2j)}$ for the optical-communication signals in the semiconductor chip 1 pertaining to the embodiment of the present invention. FIG. 10(a) illustrates an image obtained by the CMOS camera having QVGA resolution. FIG. 10(b) illustrates a reproduced image of the image illustrated in FIG. 10(a), the reproduced image is generated by the pixels $X_{i(2j)}$ for the optical-communication signals, after the optical signals of the image of FIG. 10(a) are transmitted at a carrier frequency of 5 MHz by an infrared LED array of 10×10 (wavelength of 870 mm). With regard to the locations of the LED light source of the optical signals, the coordinate generator 21 determines the X-Y address by using the flag image signals $S_{FI}$ of one bit transferred from the comparator/latching circuit 14. With regard to the X-Y address determined by the coordinate generator 21, the X-address generator 17 and the Y-address generator 13 drives the pixels $X_{i(2j)}$ for the predetermined optical-communication signals on the semiconductor chip 1, and the output signal from the pixels $X_{i(2j)}$ for the optical-communication signals is demodulated by using the demodulator 27 and reproduced as illustrated in FIG. 10(b). When the image of FIG. 10(b) is reproduced, a distance of an optical communication is 70 m. FIG. 9 and FIG. 10 show that the solid-state imaging device and the LED light source, which pertain to the embodiment of the present invention, can be used to carry out the optical communication of a long distance of 50 meters or more and the solid-state imaging device pertaining to the embodiment of the present invention can be operated at a data signal speed enough to transmit the image signals.

Figure 11:
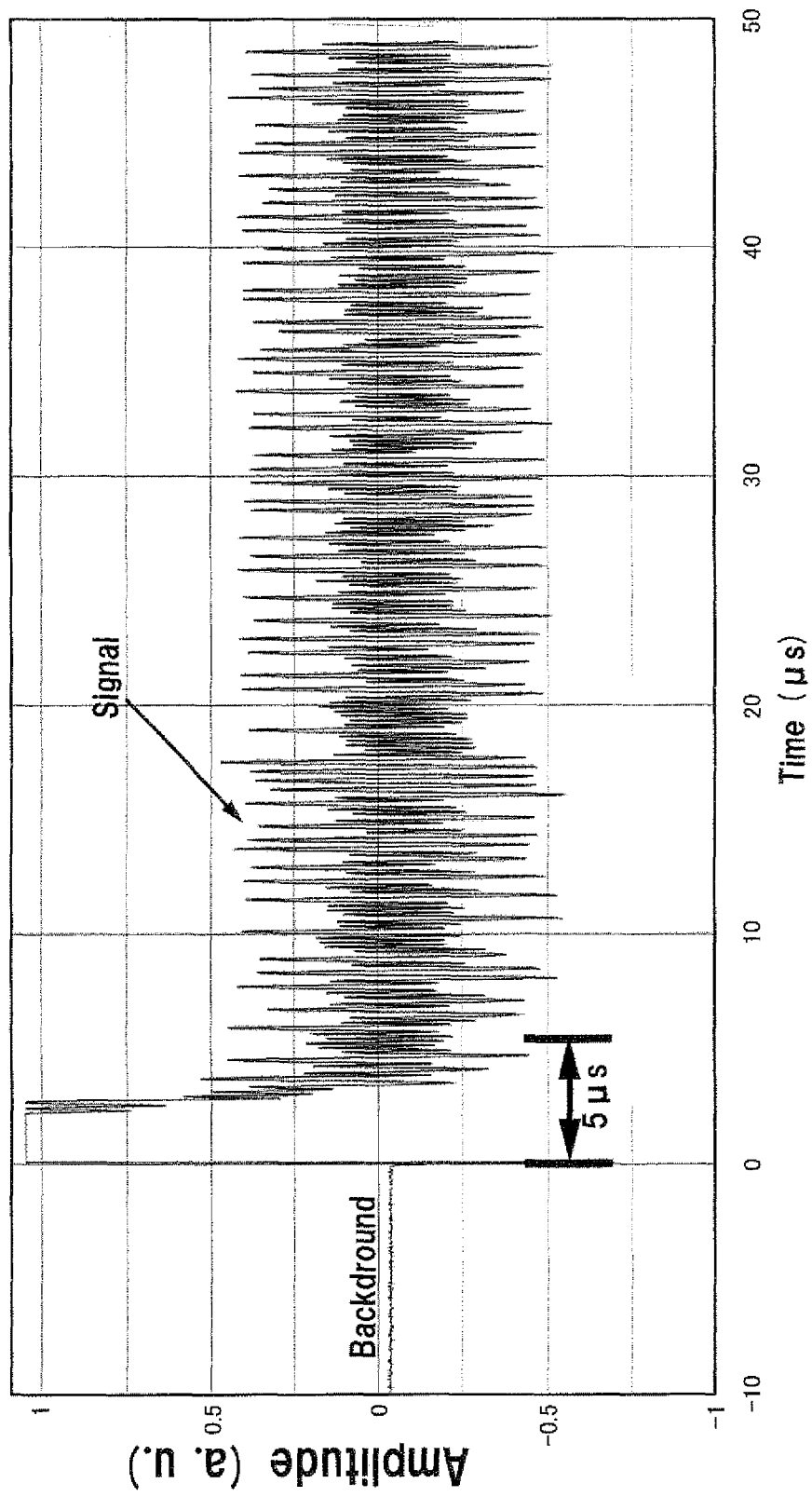
FIG. 11 is a view illustrating the response characteristic of the hybrid solid-state imaging device pertaining to the embodiment of the present invention, when the LED light source is tracked.

FIG. 11 illustrates a response characteristic of the hybrid solid-state imaging device, the response characteristic indicates a tracking performance to the LED light source, according to the hybrid solid-state imaging device pertaining to the embodiment of the present invention. After the pixels $X_{i(2j)}$ for the optical-communication signals serving as the candidate pixels, to which the image of the LED light source are irradiated, are discovered by the coordinate generator 21, FIG. 11 illustrates such that stable signals can be acquired within five micro seconds after the discovery of the candidate pixels. FIG. 11 exhibits an excellent performance of the hybrid solid-state imaging device in the application to the fields of vehicles, the performance is sufficient for the seamless real time tracking of the light source for the optical communication between road-to-vehicle or vehicle-to-vehicle.

—Optical-Information Acquisition Element—

Figure 4:
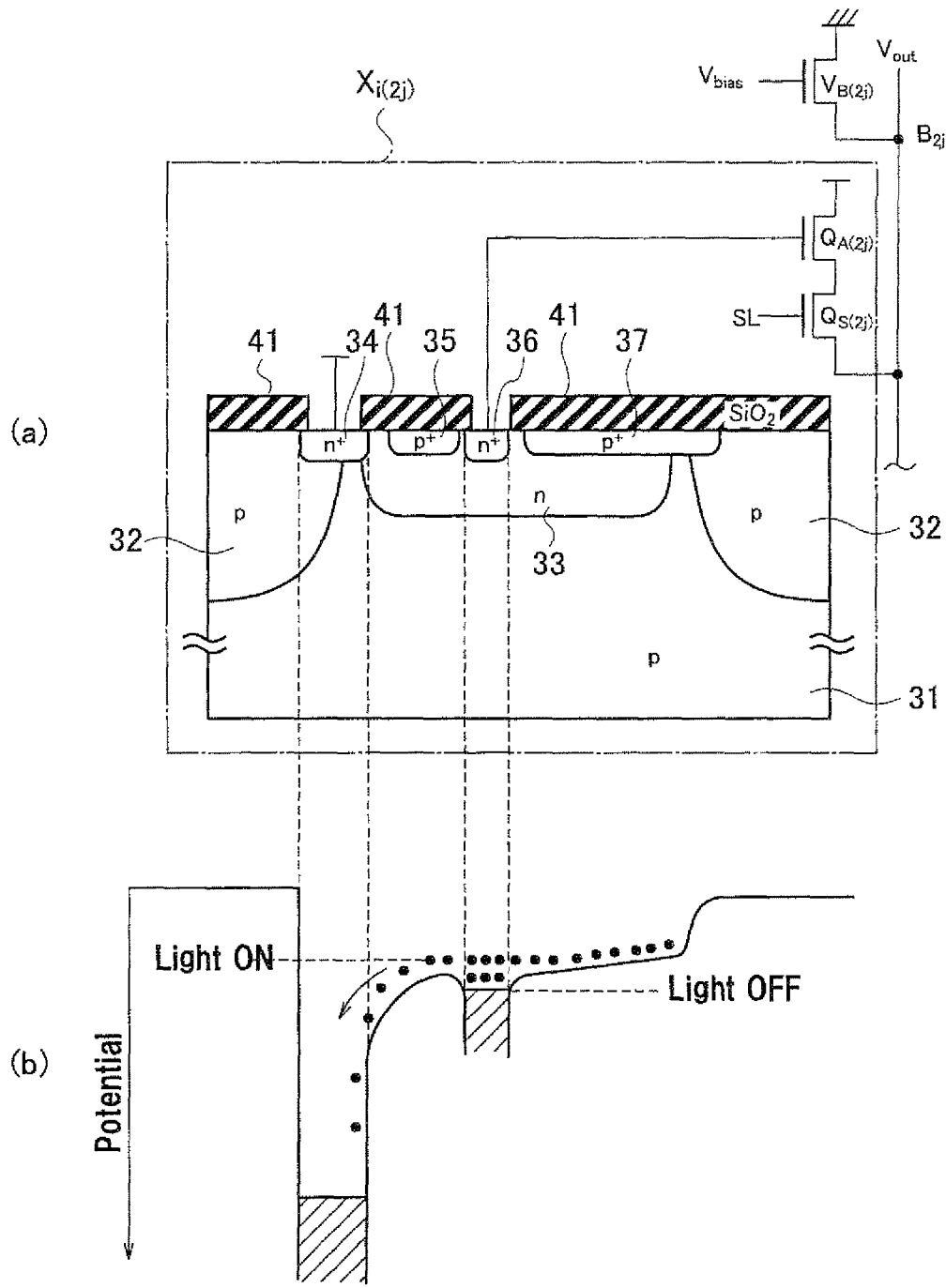
FIG. 4($a$) is a schematic cross-sectional view illustrating a part of an outline of a configuration of an optical-information acquisition element that serves as a pixel for an optical-communication signal in the hybrid solid-state imaging device pertaining to the embodiment of the present invention.

Because each of the pixels $X_{11}, \ldots, X_{i1}, \ldots, X_{(n-2)1}, X_{(n-1)1}, X_{n1}; X_{13}, \ldots, X_{i3}, \ldots; X_{(n-2)3}, X_{(n-1)3}, X_{n3}; \ldots, X_{1(2j-1)}, \ldots, X_{i(2j-1)}, \ldots, X_{(n-2)(2j-1)}, X_{(n-1)(2j-1)}, X_{n(2j-1)}; \ldots, X_{1m}, \ldots, X_{im}, \ldots, X_{(n-2)m}, X_{(n-1)m}$, and $X_{nm}$ adapted for the image signals, which are arranged on the odd-numbered columns in the pixels-array area 11 in the hybrid solid-state imaging device pertaining to the embodiment of the present invention may have the same pixels structure used in the standard CMOS image sensor, the structure of the pixels $X_{i(2j)}$ is not described in this specification. Therefore, FIG. 4(a) illustrates one example of the cross-sectional structure of the optical-information acquisition element that serves as the pixels $X_{12}, \ldots, X_{i2}, \ldots, X_{(n-2)2}, X_{(n-1)2}, X_{n2}, X_{14}, \ldots, X_{i4}, \ldots, X_{(n-2)4}, X_{(n-1)4}, X_{n4}; \ldots; X_{1(2j)}, \ldots, X_{i(2j)}, X_{(n-2)(2j)}, X_{(n-1)(2j)}, X_{n(2j)}; \ldots$ adapted for the optical-communication signals, which are arranged on the even-numbered columns. As illustrated in FIG. 4(a), the optical-information acquisition element $X_{i(2j)}$ pertaining to the embodiment of the present invention encompasses a semiconductor layer 31 of a first conductivity type (p-type). and a surface-buried region 33 of a second conductivity type (n-type) arranged on the semiconductor layer 31. The surface-buried region 33 serves as a light-receiving cathode region (charge-generation region), and the semiconductor layer 31 just under the surface-buried region (light-receiving cathode region) 33 serves as a light-receiving anode region. Consequently, the surface-buried region 33 and the semiconductor layer 31 implement the photodiode (33, 31). The circumference of the surface-buried region (light-receiving cathode region) 33 is surrounded by a well (p-well) 32 of the first conductivity type, arranged on the semiconductor layer 31. On the cross-sectional view of FIG. 4(a), the p-well 32 is shown as if the p-wells 32 are divided into the right and left portions. However, the right and left portions are respectively merged at a near side portion and a deep rearward portion of the paper and exhibit an annular pattern in an actual planar pattern. A pinning layer 37 of the first conductivity type ($p^+$-type) connected to ground potential (lower-level power supply) GND, a charge-accumulation region 36 of the second conductivity type ($n^+$-type) that is deeper at the bottom level than the pinning layer 37 and serves as a floating diffusion region, a barrier-creating region 35 of the first conductivity type ($p^+$-type) that is shallower at the bottom level than the charge-accumulation region 36 and creates a potential barrier against the outflow of the charges accumulated in the charge-accumulation region 36, and a charge-exhaust region 34 of the second conductivity type ($n^+$-type) that is deeper at the bottom level than the barrier-creating region 35 and stores and extracts the charges that surmount the potential barrier and flow out from the charge-accumulation region 36 are arranged in turn at the upper portion of the surface-buried region 33. The pinning layer 37 is the layer for suppressing the carriers from being generated on the surface at a dark time. The charge-exhaust region 34 is connected to the positive power supply potential (high-level power supply) $V_{DD}$, and the charges (electrons) stored in the charge-exhaust region 34 are extracted toward the positive power supply potential (high-level power supply) $V_{DD}$. That is, on the plan view (top view) whose illustration is omitted, the pinning layer 37, the charge-accumulation region 36, the barrier-creating region 35 and the charge-exhaust region 34 are arranged adjacently to each other, inside the pattern of the p-well 32 that is annularly arranged on the semiconductor layer 31. On the cross-sectional view of FIG. 4(a), the pinning layer 37, the charge-accumulation region 36, the barrier-creating region 35 and the charge-exhaust region 34 are arranged in turn from the right side to the left side. However, the arrangement is not limited to the above. Then, a topology in which the pinning layer 37, the charge-accumulation region 36, the barrier-creating region 35 and the charge-exhaust region 34 are arranged in turn from the left side to the right side may be used, and the array of the pinning layer 37, the charge-accumulation region 36, the barrier-creating region 35 and the charge-exhaust region 34 is not always located on a straight line.

FIG. 4(a) exemplifies a case in which the semiconductor layer 31 of the first conductivity type (p-type) is used as "the semiconductor base-body region of the first conductivity type". However, instead of the semiconductor layer 31, a double-level structure implemented by a semiconductor substrate of the first conductivity type (p$^+$-type) whose impurity concentration is about $4 \times 10^{17}$ cm$^{-3}$ or more and about $1 \times 10^{21}$ cm$^{-3}$ or less, and an epitaxial growth layer of the first conductivity type (p-type) that is arranged on the semiconductor substrate having a lower impurity concentration than the semiconductor substrate is formed, and the epitaxial growth layer of the first conductivity type may be employed as "the semiconductor base-body region of the first conductivity type". Or, a silicon epitaxial growth layer of the first conductivity type (p-type) is formed on the semiconductor substrate of the second conductivity type (n-type), and the epitaxial growth layer may be employed as the semiconductor layer 31 of the first conductivity type. Then, in the structure such that the epitaxial growth layer of the first conductivity type (p-type) is formed on the semiconductor substrate of the second conductivity type (n-type) so as to form the pn junction, when the light having a longer wavelength penetrates into the deeper portion of the semiconductor substrate of the second conductivity type, because the potential barrier caused by the built-in potential of the pn junction disables the carriers, which are generated by the light in the semiconductor substrate of the second conductivity type, to penetrate into the epitaxial growth layer of the first conductivity type, the carriers generated in the deeper portion of the semiconductor substrate of the second conductivity type can be positively extracted. Therefore, the pn junction can protect the carriers generated in the deeper position from being returned to upper portion through diffusion and leaked to the adjacent pixels. Therefore, the architecture of the pn junction structure achieves a technical advantage such that the pn junction disables the mixture of colors, in particular, in a case of an image sensor of a single-chip color in which color filters of RGB are provided.

On the semiconductor layer 31, an insulation film 41 is formed so as to cover the surfaces of the pinning layer 37 and the barrier-creating region 35. On the charge-accumulation region 36 and the charge-exhaust region 34, contact windows are cut in the insulation film 41 so that surface wirings can be contacted to the charge-accumulation region 36 and the charge-exhaust region 34. As the insulation film 41, although a silicon oxide film (SiO$_2$) is preferable, various insulation films other than the silicon oxide film (SiO$_2$) may be available. For example, an ONO film implemented by a triple-level lamination film made of silicon oxide film (SiO$_2$)/silicon nitride film (Si$_3$N$_4$ film)/silicon oxide film (SiO$_2$) may be available. Moreover, the oxide that includes at least one element of strontium (Sr), aluminum (Al), magnesium (Mg), yttrium (Y), hafnium (Hf), zirconium (Zr), tantalum (Ta) and bismuth (Bi), or the silicon nitride that includes those elements, or the like can be used as the insulation film 41.

A gate electrode of a read-out transistor $Q_{A(2j)}$ implementing an amplifier 15 whose equivalent circuit is indicated on the upper portion of the right side of FIG. 4(a) is connected, through a contact window being cut in the insulation film 41, to the charge-accumulation region 36. A drain electrode of the read-out transistor $Q_{A(2j)}$ is connected to the high-level power supply $V_{DD}$, and a source electrode is connected to a drain electrode of a select transistor $Q_{S(2j)}$. In the cross-sectional structure illustrated in FIG. 4(a), when the semiconductor layer 31 is made of a silicon substrate whose impurity concentration is about $6 \times 10^{11}$ cm$^{-3}$ or more and about $2 \times 10^{16}$ cm$^{-3}$ or less, the standard CMOS process can be employed.

In the optical-information acquisition element pertaining to the embodiment of the present invention, the photodiode (33, 31), as illustrated in FIG. 4(a), is so formed that the n-type surface-buried region 33 is sandwiched, at both sides along the upper and lower directions, between the p-type semiconductor layer 31 and the p-type barrier-creating region 35, and consequently most of the surface-buried region 33 is depleted. In a part of the photodiode (33, 31) of the buried structure, the charge-accumulation region 36 is formed from the surface, and the potential level at the photodiode (33, 31) is applied through the charge-accumulation region 36 to the gate of the read-out transistor $Q_{A(2j)}$ for the source follower, and the potential level at 3) the photodiode (33, 31) is read out through the vertical signal line $B_{2j}$ to the outside. On the left side of the charge-accumulation region 36, a potential barrier is created in a shape of a hill, the height of the hill is determined by the depleted potential level at the photodiode (33, 31). Further left side of the hill, there is the charge-exhaust region 34 connected to the positive power supply potential (high-level power supply) $V_{DD}$. The potential barrier created between the charge-accumulation region 36 and the charge-exhaust region 34 can be designed by a similar design principle for creating a potential barrier in the channel of a junction type static induction transistor (SIT), which manifests the normally-off I-V characteristic. Namely, if the n-type surface-buried region 33 is assumed to correspond to the channel region of the SIT, the p-type semiconductor layer 31 and the p-type barrier-creating region 35 correspond to the gate regions of the SIT, the n-type charge-accumulation region 36 corresponds to the source region of the SIT, and the n-type charge-exhaust region 34 corresponds to the drain region of the SIT, the creation of the potential barrier between the charge-accumulation region 36 and the charge-exhaust region 34 can be easily understood.

FIG. 4(b) illustrates a potential profile of the conduction band on the surface of the semiconductor layer 31. That is, FIG. 4(b) is the potential diagram at a horizontal plane, in the cross-sectional view of FIG. 4(a), by which the pinning layer 37 and the surface-buried region 33 just under the barrier-creating region 35 are cut at a horizontal level so as to include the bottoms of the charge-accumulation region 36 and the charge-exhaust region 34. In FIG. 4(b), charges (electrons) are indicated by closed circles. In the description of the optical-information acquisition element pertaining to the embodiment, the case in which the first conductivity type is assigned as the p type, the second conductivity type is assigned as the n type, and the charges on which the process such as the transfer, the accumulation and the like is performed is assigned as electrons is exemplarily described. For this reason, in the potential diagram illustrated in FIG. 4(b), the lower direction (depth direction) of the drawing is represented as the positive direction of the potential, and the lower direction is the direction of the field to which the charges generated in the photodiode (33, 31) are transported. Thus, in the case when the first conductivity type is assigned as the n type and the second conductivity type is assigned as the p type, the electrical polarities become opposite, the charges to be processed become holes. However, for holes, the potential profile that indicates the potential barrier, potential valley, potential well and the like inside the optical-information acquisition element are represented such that the lower direction (depth direction) of the drawing is assigned as the negative direction of the potential. However, for the case in which the charges are assigned as holes, although the potential becomes opposite, the lower direction of FIG. 4(b) is also the direction of the field to which charges (holes) generated in the photodiode are transported.

In the potential wells generated at the locations of the charge-accumulation region 36 and the charge-exhaust region 34, a portion indicated by diagonal hatch pattern with upward oblique lines to the right is the potential level at which electrons are filled, and the top edge of the region indicated by the diagonal hatch pattern with the upward oblique lines to the right is the location of the Fermi level. Thus, the locations of the top edges of the regions indicated by the diagonal hatch pattern with the upward oblique lines to the right correspond to the locations (potential levels) of the bottom levels of the potential wells created by each of the charge-accumulation region 36 and the charge-exhaust region 34. As illustrated in FIG. 4(b), in order that the height of the potential barrier when the surface-buried region 33 is perfectly depleted is shallower than the location (potential level) of the bottom level of the potential well created by the charge-accumulation region 36, for example, the impurity concentrations of the surface-buried region 33, the barrier-creating region 35 and the charge-accumulation region 36 may be selected.

Because most of the surface-buried region 33 in the optical-information acquisition element pertaining to the embodiment of the present invention is designed to be depleted, as illustrated in FIG. 4(b), by controlling the height of the potential barrier created between the charge-exhaust region 34 and the charge-accumulation region 36, it is possible to design that, by surmounting the potential barrier, a desirable excessive current flows to the charge-exhaust region 34.

The height of the potential barrier created between the charge-accumulation region 36 and the charge-exhaust region 34 can be determined on the basis of a perfectly depleted potential V. For example, as illustrated in FIG. 5(a), in the n-type surface-buried region 33 whose surface is covered with oxide film, the perfectly depleted potential $V_d$ created in the surface-buried region 33, which is caused by the p-type semiconductor layer 31 formed under the lower surface of the surface-buried region 33, is determined by the following Eq. (9), when the depletion-layer approximation is used and for the depletion-layer regions of the n type and the p type, the Poisson's equation and the charge neutrality condition:

$$x_n N_d = x_{dp} N_a \quad (8)$$

in the entire semiconductor illustrated in FIG. 5(a) are used.

$$V_d = (q/2 \epsilon_s)(x_n^2 N_d + x_{dp}^2 N_a) = (q/2 \epsilon_s) x_n^2 N_d (1 + N_d/N_a) \quad (9)$$

Here, $x_n$, indicates a width of the n-type region illustrated in FIG. 5(a), $x_{dp}$ indicates a width of a depletion-layer of the p-type region when the n-type region is perfectly depleted, $N_a$ indicates an acceptor concentration, and $N_d$ indicates a donor concentration. As illustrated in FIG. 5(b), the value of the perfectly depleted potential $V_d$ is greater than the value of a built-in potential $V_{bi}$ of the pn junction in a thermal equilibrium state.

The optical-information acquisition element pertaining to the embodiment of the present invention illustrated in FIG. 4(a) has a p-n-p structure in which differently from FIG. 5(a), the n-type surface-buried region 33 is sandwiched, at both sides along the upper to lower directions, between the p-type semiconductor layer 31 and the p-type barrier-creating region 35. Thus, the height of the potential barrier can be determined by the design scheme similar to the design scheme of the height of potential barrier, which is determined by the height of the saddle point formed in the channel of the normally-off SIT. That is, the height of the potential barrier created between the charge-accumulation region 36 and the charge-exhaust region 34 can be routinely determined on the basis of the respective impurity concentrations of the surface-buried region 33, the semiconductor layer 31, the barrier-creating region 35, the charge-accumulation region 36 and the charge-exhaust region 34, a distance between the semiconductor layer 31 and the barrier-creating region 35, a distance between the charge-accumulation region 36 and the charge-exhaust region 34, and a value of a voltage applied to the charge-exhaust region 34, which is similar to the design scheme of the normally-off SIT.

Figure 6:
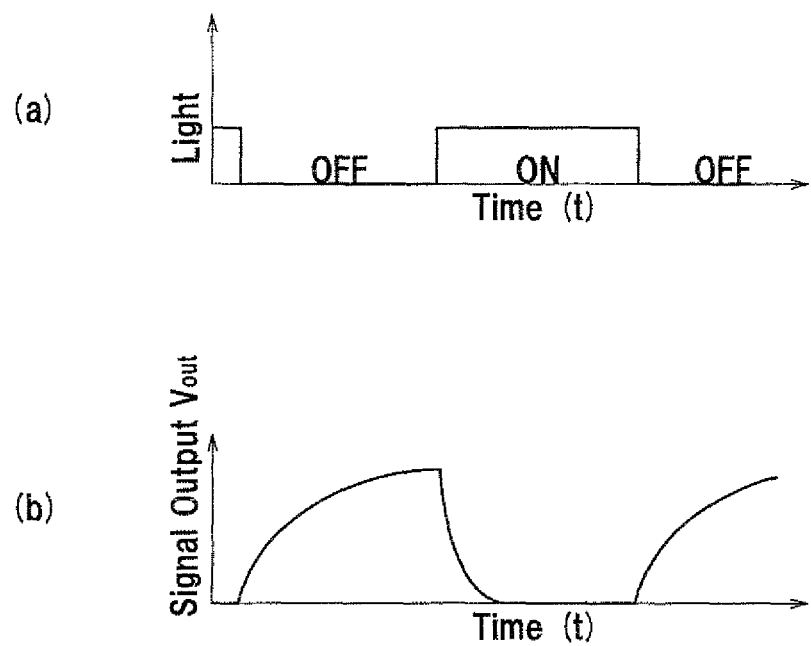
FIG. 6 is a timing chart illustrating an operation of the optical-information acquisition element pertaining to the embodiment of the present invention.

As illustrated in FIG. 6(a), when optical pulses are irradiated to the photodiode (33, 31) (when the optical pulse is turned on), the generated electrons are collected to the charge-accumulation region 36 on the center of the surface-buried region 33 and accumulated in the charge-accumulation region 36. This accumulation decreases the potential level of the charge-accumulation region 36. A current $I_d$ that surmounts the potential barrier between the charge-accumulation region 36 and the charge-exhaust region 34 and flows into the charge-exhaust region 34 can be represented by the following Eq. (10).

$$I_d = I_{do} \exp(-q\phi_B/kT) \quad (10)$$

Thus, while the excessive current flows into the charge-exhaust region 34 to which a higher-level voltage is applied on the left side of the surface-buried region 33, electrons are accumulated in the charge-accumulation region 36, and electrons are imperfectly accumulated in the charge-accumulation region 36. When the optical current flowing into the charge-accumulation region 36 and the current flowing out from the charge-accumulation region 36 are balanced, the change in the potential level at the photodiode (33, 31) is stopped. When the potential level of the charge-accumulation region 36 is assigned as $V_{FD}$, the following Eq. (11) is established.

$$I_d = I_{do} \exp(-q(V_{FD} - \phi_{BO})/kT) = I_{do} \exp(-qV_{FD}/kT) \quad (11)$$

When the optical pulse is turned off, the supply of the optical current is stopped, and because electrons flow out to the charge-exhaust region 34, the potential level at the photodiode (33, 31) increases as illustrated in FIG. 6(b). The outflow current exhibits an exponential function of the height of the potential barrier, which is formed in the path to the charge-exhaust region 34. As the outflow of the charges to the charge-exhaust region 34 increases, the potential barrier becomes higher, and the outflow current is gradually decreased. The increase of the potential level at the photodiode (33, 31) continues until a next optical pulse is irradiated, as illustrated in FIG. 6(b). As illustrated in FIG. 6(a), when the optical pulse is again irradiated, the potential at the charge-accumulation region 36 is again decreased as illustrated in FIG. 6(b). When the parasitic capacitance of the charge-accumulation region 36 is assigned as $C_{FD}$ and the optical current flowing into the charge-accumulation region 36 from the photodiode (33, 31) is assigned as $I_p$, $I_p$ can be represented by the following Eq. (12) when the optical pulse is irradiated.

$$I_{do}\exp(-qV_{FD}/kT)+C_{FD}dV_{FD}/dT=I_p \qquad (12)$$

Thus, the optical response illustrated in FIG. 6(b) can be understood. In this way, the potential level of the charge-accumulation region 36 responds to the on/off operations of the optical pulse and serves as an optical pulse receiving circuit.

In order to make the speed of the response of the optical-information acquisition element pertaining to the embodiment of the present invention higher, the equivalent capacitance of the optical-information acquisition element such as the parasitic capacitance $C_{FD}$ or the like is required to be made small. Furthermore, the potential profile of the photodiode (33, 31) portion is desirably shaped such that, as illustrated in FIG. 4(b), an inclination of the potential level is created in the perfectly depleted potential $V_d$ so that electrons can be accelerated by an electric field toward the charge-accumulation region 36. Also, the potential profile of the flow path toward the charge-exhaust region 34 from the charge-accumulation region 36 is desirably shaped such that the electric field is generated by the inclination of the potential level in the perfectly depleted potential $V_d$. By the architecture of providing the inclined potential profiles, in the region where the potential inclination is created in the perfectly depleted potential $V_d$, because the parasitic capacitance of the photodiode (33, 31) portion in the optical-information acquisition element cannot be generated, and only the capacitance associated with the limited region in which electrons are accumulated in the vicinity of the charge-accumulation region 36 shall be considered, the high-speed response of the optical-information acquisition element can be expected.

Figure 7:
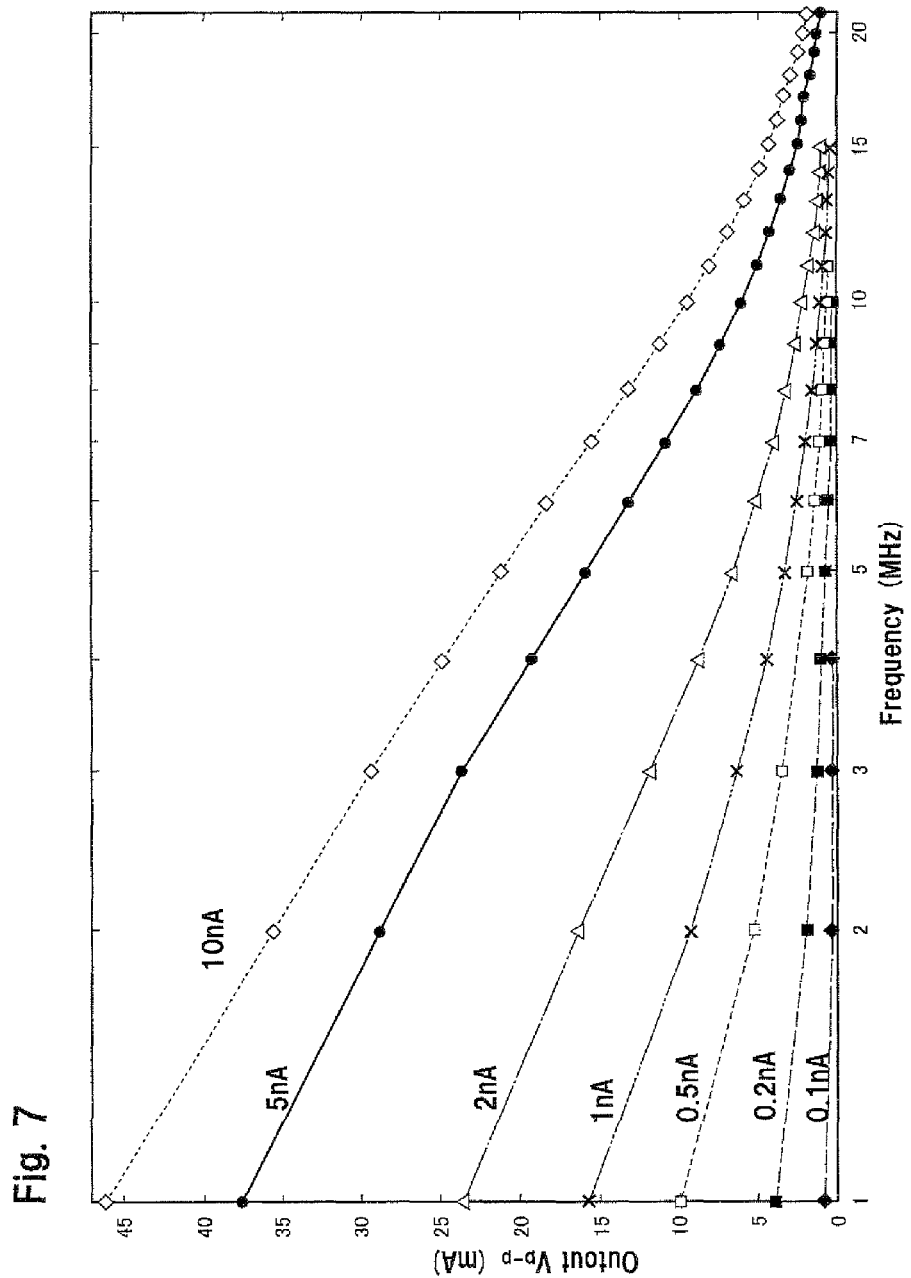
FIG. 7 is a view illustrating a frequency dependence characteristic of the amplitude of potential at the charge-accumulation region, when the power of the light emitted from an LED light source, irradiating the optical-information acquisition element pertaining to the embodiment of the present invention, is changed.

FIG. 7 illustrates variations of the amplitudes of potentials at the charge-accumulation region 36 with respect to the variation of frequency of the pulse, as a measurement result. In the measurement, the intensity of the LED light source irradiating the optical-information acquisition element illustrated in FIG. 4, pertaining to the embodiment of the present invention, is changed, so that the intensity of the optical currents generated in the photodiode (33, 31) can be changed as 10 nA, 5 nA, 2 nA, 1 nA, 0.5 nA, 0.2 nA or 0.1 nA. FIG. 7 illustrates such that, with respect to the pulse of the optical current of 10 nA, the amplitude of about 9 mV is obtained at 10 MHz from the charge-accumulation region 36.

According to the structure of the optical-information acquisition element pertaining to the embodiment of the present invention illustrated in FIG. 4(a), it is possible to remove the reset transistors (36, 39) used in the earlier technology, which has been illustrated in FIG. 12, and therefore, the reduction in the number of the elements and the simplification of the circuit configuration, and furthermore, reduction of the parasitic capacitance of the optical-information acquisition element are achieved, and therefore the optical-information acquisition element can carry out the high-speed response.

Other Embodiment

As mentioned above, the present invention has been described in accordance with the embodiment of the present invention. However, the discussions and drawings that implement a part of this disclosure should not be understood to limit the scope of the present invention. From this disclosure, various variations, examples and operational techniques would be evident for one skilled in the art.

In the description of the embodiment of the present invention as mentioned already, the first conductivity type was assigned as the p type, and the second conductivity type was assigned as the n type. However, the first conductivity type could be assigned as the n type and the second conductivity type could be assigned as the p type. Even in the case that the first conductivity type is assigned as the n type and the second conductivity type could is assigned as the p type. the similar effectiveness may be easily understood to be achieved when the electrical polarities are made opposite. In the description of the embodiment of the present invention, the process such as the transfer operation, the accumulation operation and the like is performed is executed under the assumption that the charges to be processed are electrons, and in the potential diagram, the lower direction (depth direction) of the drawing is assigned as the positive direction of the potential. However, in the case when the electrical polarities are made opposite, because the charges to be processed become holes, the potential profile that illustrates the potential barrier, the potential valley, the potential well and the like in the inside of the optical-information acquisition element shall be represented such that the lower direction (depth direction) of the drawing is ID the negative direction of the potential.

Also, in the description of the embodiment of the present invention as mentioned already, the hybrid solid-state imaging device (area sensor) in which a plurality of the optical-information acquisition element and a plurality of the pixels for the image signals are merged and two-dimensionally arrayed is exemplarily described. However, the optical-information acquisition element in the present invention should not be construed limitedly to the application to only the pixels for the hybrid solid-state imaging device in the two-dimensional array. For example, a plurality of optical-information acquisition elements and pixels for the image signals can be merged and arrayed in a one-dimension configuration, which may corresponds to an architecture of i=n=1 in the two-dimensional matrix illustrated in FIG. 1, so as to implement the hybrid solid-state imaging device (line sensor) of the one-dimensional array, can be easily understood from the subject matter of the above disclosure.

Moreover, in the description of the embodiment of the present invention as mentioned already, the hybrid solid-state imaging device in which a plurality of the optical-information acquisition element and a plurality of the pixels for the image signals are arrayed on the same semiconductor chip is exemplified. However, the realization of the configuration in which the pixels for the image signals is omitted and a plurality of the optical-information acquisition elements for the optical communication are two-dimensionally or one-dimensionally arrayed, configured to track the light source, can be easily understood from the subject matter of the above disclosure.

Moreover, although FIG. 4(a) illustrates a configuration that the p-n-p structure in which the n-type surface-buried region 33 is sandwiched, at both sides along the upper to lower directions, between the p-type semiconductor layer 31 and the p-type barrier-creating region 35 is used to create the potential barrier between the charge-accumulation region 36 and the charge-exhaust region 34, the configuration illustrated in FIG. 4(a) merely indicates an example. For example, with regard to the potential barrier between the charge-accumulation region 36 and the charge-exhaust region 34, the p-type barrier-creating region 35 can be periodically buried in the shape of stripes in a certain depth of the n-type surface-buried region 33, and consequently, potential barriers can be created between the stripe-shaped barrier-creating regions 35 and the stripe-shaped barrier-creating regions 35. Also, similarly to a recessed gate SIT, the p-type barrier-creating regions 35 may be formed in the bottoms or side walls of stripe-shaped grooves, which are periodically cut in the n-type surface-buried region 33, and the potential barrier may be created between the stripe-shaped barrier-creating region 35 and the stripe-shaped barrier-creating region 35. That is, similarly to the fact that there are various structures in normally-off SITs, there are various schemes by which the potential barriers are created between the charge-accumulation region 36 and the charge-exhaust region 34.

In this way, the present invention naturally includes various embodiments that are not described herein. Thus, the technical scope of the present invention is determined only by "the matters specifying the invention" prescribed by reasonable claims from the above-mentioned description.

INDUSTRIAL APPLICABILITY

The present invention can be used in the technical field such as the system or the like in which with the use of the spatial wireless communication through the light, the map information and the information adapted for safe driving of the vehicle can be transmitted and received between road-to-vehicle or between vehicle-to-vehicle.

REFERENCE SIGNS LIST 1 semiconductor chip
2 external system
11 pixel array area
12 row driver
13 Y-address generator
14 comparator/latching circuit
15 amplifier
15 correlative double sampling circuit
16 horizontal read-out circuit
17 X-address generator
18 band-pass amplifier
19 address signal distributor
21 coordinate generator
22 second AD converter
23 first AD converter
24 second adder
25 first adder
26 pulse equalizer
27 demodulator
31 semiconductor layer
32 p-well
33 surface-buried region
34 charge-exhaust region
35 barrier creating region
36 charge-accumulation region
37 pinning Layer
39 reset-drain region

The invention claimed is:
1. An optical-information acquisition element comprising:
a semiconductor layer of a first conductivity type;
a surface-buried region of a second conductivity type buried in a part of an upper portion of the semiconductor layer so as to implement a photodiode with the semiconductor layer;
a charge-accumulation region of the second conductivity type buried in a part of the upper portion of the surface-buried region, configured to accumulate a part of charges generated by the photodiode;
a barrier-creating region of the first conductivity type buried adjacent to the charge-accumulation region in a part of the upper portion of the surface-buried region, impurity concentrations of the surface-buried region, the barrier-creating region and the semiconductor layer are respectively selected such that a portion of the surface-buried region between the barrier-creating region and the semiconductor layer is perfectly depleted, configured to create a potential barrier in the perfectly depleted portion of the surface-buried region; and
a charge-exhaust region of the second conductivity type buried adjacent to the surface-buried region in a limited area of the upper portion of the semiconductor layer, being contacted to the surface-buried region so as to define a path of excess charges from the charge-accumulation region via the potential barrier toward the charge-exhaust region, configured to store and to extract the excess charges which surmount the potential barrier and flow out from the charge-accumulation region through the path,
wherein, changes of potential level of the charge-accumulation region, determined by the charges accumulated in the charge-accumulation region on the basis of a height of the potential barrier in association with on and off operations of optical-communication signals, are extracted as signals.

2. An optical-information-acquisition element array comprising a plurality of optical-information acquisition elements arrayed a same semiconductor chip, each of the plurality of optical-information acquisition elements comprises:
a semiconductor layer of a first conductivity type;
a surface-buried region of a second conductivity type buried in a part of an upper portion of the semiconductor layer so as to implement a photodiode with the semiconductor layer;
a charge-accumulation region of the second conductivity type buried in a part of an upper portion of the surface-buried region, configured to accumulate a part of charges generated by the photodiode;
a barrier-creating region of the first conductivity type buried adjacent to the charge-accumulation region in a part of the upper portion of the surface-buried region, impurity concentrations of the surface-buried region, the barrier-creating region and the semiconductor layer are respectively selected such that a portion of the surface-buried region between the barrier-creating region and the semiconductor layer is perfectly depleted, configured to create a potential barrier in the perfectly depleted portion of the surface-buried region; and
a charge-exhaust region of the second conductivity type buried adjacent to the surface-buried region in a limited area of the upper portion of the semiconductor layer, being contacted to the surface-buried region so as to define a path of excess charges from the charge-accumulation region via the potential barrier toward the charge-exhaust region, configured to store and to extract the excess charges which surmount the potential barrier and flow out from the charge-accumulation region through the path,
wherein changes of potential level of the charge-accumulation region, determined by the charges accumulated in the charge-accumulation region on the basis of a height of the potential barrier, are extracted as signals from each of the plurality of optical-information acquisition elements.

3. A hybrid solid-state imaging device comprising:
a plurality of optical-information acquisition elements arrayed on a semiconductor chip; and
a plurality of pixels for detecting image signals, arrayed on the same semiconductor chip, being merged with the plurality of the optical-information acquisition elements,
wherein each of the plurality of optical-information acquisition elements comprises:
a semiconductor layer of a first conductivity type;
a surface-buried region of a second conductivity type buried in a part of an upper portion of the semiconductor layer so as to implement a photodiode with the semiconductor layer;
a charge-accumulation region of the second conductivity type buried in a part of an upper portion of the surface-buried region, configured to accumulate a part of charges generated by the photodiode;
a barrier-creating region of the first conductivity type buried adjacent to the charge-accumulation region in a part of the upper portion of the surface-buried region, impurity concentrations of the surface-buried region, the barrier-creating region and the semiconductor layer are respectively selected such that a portion of the surface-buried region between the barrier-creating region and the semiconductor layer is perfectly depleted, configured to create a potential barrier in the perfectly depleted portion of the surface-buried region; and
a charge-exhaust region of the second conductivity type buried adjacent to the surface-buried region in a limited area of the upper portion of the semiconductor layer, being contacted to the surface-buried region so as to define a path of excess charges from the charge-accumulation region via the potential barrier toward the charge-exhaust region, configured to store and to extract the excess charges which surmount the potential barrier and flow out from the charge-accumulation region through the path,
wherein changes of potential level of the charge-accumulation region, determined by the charges accumulated in the charge-accumulation region on the basis of a height of the potential barrier in association with on and off operations of optical-communication signals, are extracted as signals from each of the plurality of optical-information acquisition elements, and image signals are extracted respectively from the plurality of pixels for the image signals.

* * * * *